United States Patent [19]

Ogawa

[11] Patent Number: 4,747,553
[45] Date of Patent: May 31, 1988

[54] METHOD AND APPARATUS FOR TAKING UP TAPING TAPE LOADED WITH ELECTRONIC PARTS THEREIN

[75] Inventor: Hirotsugu Ogawa, Tokyo, Japan

[73] Assignee: FSK Corporation, Tokyo, Japan

[21] Appl. No.: 49,321

[22] Filed: May 13, 1987

[30] Foreign Application Priority Data

May 14, 1986 [JP] Japan .................. 61-111291

[51] Int. Cl.⁴ .................. B65H 18/08; B65H 81/00
[52] U.S. Cl. .................. 242/56 R; 242/67.1 R; 156/184
[58] Field of Search .................. 242/55, 56 R, 67.1 R, 242/67.3 R, 164, 58.5; 206/389, 411; 156/443, 184; 53/118

[56] References Cited

U.S. PATENT DOCUMENTS

| 1,465,786 | 8/1923 | Wheildon | 242/58.5 X |
| 1,560,555 | 11/1925 | Flynn | 242/58.5 X |
| 3,805,652 | 4/1974 | LaLonde et al. | 242/56 R |

Primary Examiner—David Werner
Attorney, Agent, or Firm—Cushman, Darby & Cushman

[57] ABSTRACT

A method of taking up tape storing chip type parts therein and a device for doing so in which the tape is wound on a reel, and cut to form a tape leader which is taped to the peripheral surface of the outermost tape winding.

2 Claims, 6 Drawing Sheets

METHOD AND APPARATUS FOR TAKING UP TAPING TAPE LOADED WITH ELECTRONIC PARTS THEREIN

BACKGROUND OF THE INVENTION

The present invention relates to an improved take-up method and an apparatus adapted to wind onto a take-up reel a taping tape comprising an embossed paper or plastic tape loaded with chip type electronic parts.

The taping tape comprises a storage tape for storing electronic parts therein and a cover tape deposited on the upper surface of the storage tape. For taking up such taping tape, the following means has hitherto been employed. That is, the taping machine which has been operated at the previous step is stopped, the top end of the taping tape is inserted into the groove in the core of the take-up reel by hand and after winding the tape around the reel core by 1 to 2 times, the take-up reel is rotated by the motor. Then, at the final step of taking up the taping tape, the non-deposited portion of the embossed storage tape having no electronic part stored therein and that of the cover tape of the taping tape prepared in advance are drawn out, the drawn out portion of the embossed tape is cut manually leaving the drawn out portion of the cover as an extension serving as a leader of the taping tape and after confirmation of completion of a predetermined amount of windings, the leader of the tape is applied by hand and fixed to the peripheral surface of the outermost winding of the taken up tape by using an adhesive tape, thereby preventing the unwinding of the taping tape.

However, the following defects have been pointed out with respect to the conventional method. That is, the method of inserting the taping tape into the reel core manually takes much time and labor since it requires an operation of handling the tip of the taping tape of narrow width within the small clearance between the side plates of the take-up reel and so the series of steps including the preceding and succeeding steps must be interrupted. Further, as the formation of the leader of the taping tape has been performed manually, the series of steps has also had to be interrupted here. Thus, upon completion of winding of the taping tape by a predetermined amount, the rear end of the tape is fixed to the peripheral surface of the taken up portion of the tape also manually by using an adhesive tape but all these manual operations require interruption of the series of steps resulting in increasing cost so that it has been strongly desired to reduce these steps.

SUMMARY OF THE INVENTION

An object of the present invention is to provide an improved take-up method in which, in consideration of the defects of the prior art method, the conventional manual operations are replaced by mechanical operations of an apparatus and all the steps of the tape winding process are automated to perform a series of operations thereby reducing the workload and cost.

Another object of the present invention is to provide an improved take-up apparatus used for performing the above-mentioned method.

In order to achieve the above objects, a method is established which comprises the steps of: causing a taping tape (consisting of an embossed tape storing an electronic part therein and a cover tape) to enter and engage an opening formed in the core of the take-up reel through a guide mechanism arranged adjacent the core; cutting by a cutter means, at the final stage of winding, a non-deposited portion of the embossed tape while holding a non-deposited portion of the cover tape by a holder means so that a tape leader consisting only of the non-deposited portion of the cover tape is formed at the end of the taping tape; and upon completion of winding, applying and fixing the leader portion onto the outer peripheral surface of the outermost winding of the taping tape with an adhesive tape supplied from an adhesive tape supply mechanism by means of an adhesive tape applying means comprising a movable arm. As a result, a novel taping tape take-up method and an apparatus for performing the method have been provided by the present invention.

DETAILED DESCRIPTION OF PREFERRED EMBODIMENTS

Preferred embodiments of the present invention will now be described with reference to the accompanying drawings.

Figure 1:
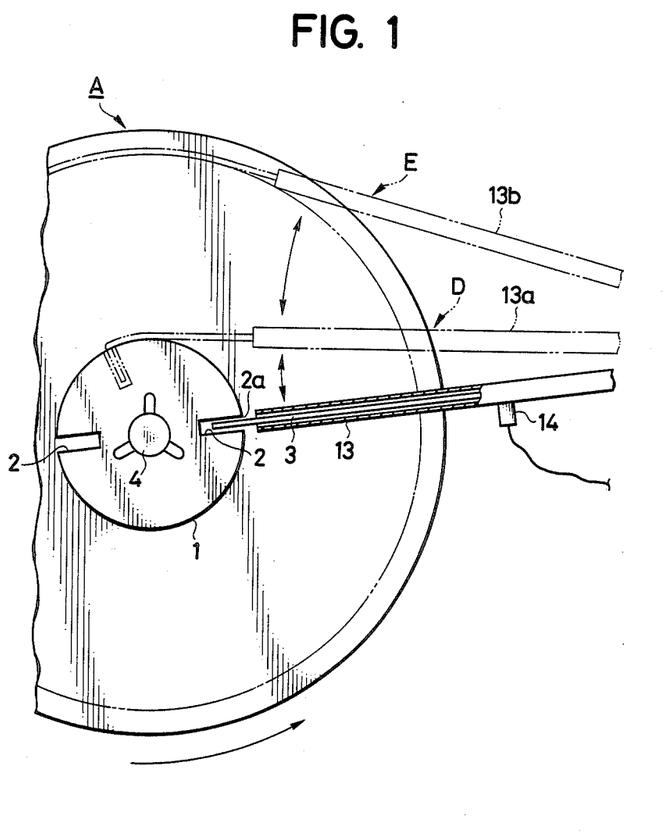
FIG. 1 is an illustrative view showing a state in which a taping tape according to the present invention begins to be wound around a reel.
Figure 2:
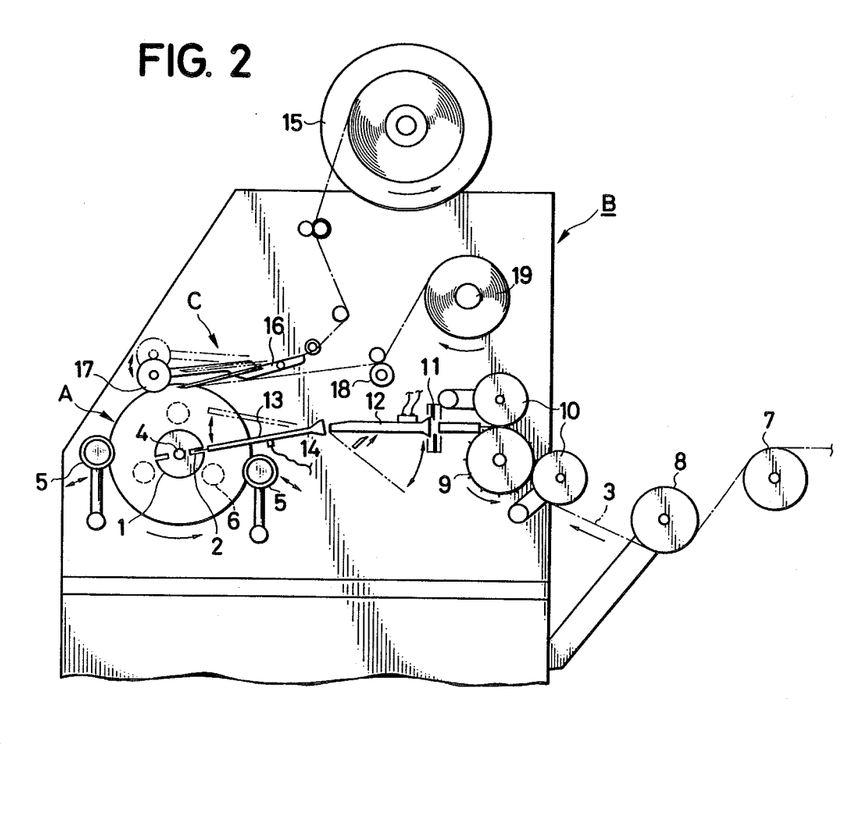
FIG. 2 is a side view of a take-up apparatus according to the present invention.

FIG. 1 is a view illustrating a state in which a taping tape begins to be wound up around a take-up reel and FIG. 2 is a side view of a take-up apparatus.

As shown, a take-up reel A is made of paper or plastic material and has dimensions such that the outer diameter of the reel is 178 mm, the inner measurement of the width thereof is 10 mm and the outer diameter of the reel core is more than 50 mm. On the outer peripheral surface of the reel core 1 there are formed a plurality of grooves 2 spaced apart from each other circumferentially by an angle of either 90°, 120° or 180°. The groove 2 has a width of about 5 mm and a depth of more than about 15 mm with respect to the inner measurement thereof. Further, the groove 2 is so formed that the top end of a taping tape 3 may be inserted into the groove, the inserted portion of the tape may be bent to engage the groove so that the remaining portion of the tape are taken up around the outer periphery of the reel core 1 in succession.

At the same time, a take-up apparatus B having the take-up reel A mounted therein and adapted to wind up the taping tape is formed as shown in FIG. 2.

It should be noted that the take-up reel A is shown without one of its side plates which is omitted for the sake of convenience of description.

The take-up reel A is made rotatable while the center of its core is inserted into a main shaft 4 of a drive moter (not shown) and is provided on both sides thereof with reel guides 5 which are movable right and left when the take-up reel A is mounted or dismounted. Further, on the side of the drive motor there is provided an operating member (not shown) capable of moving forward and rearward from a direction intersecting at right angles with respect to the side surface of the take-up reel A and a plurality of sucking pads 6 for sucking an unloaded reel are arranged on the top end of the operating member.

The taping tape 3 carried from the previous step is passed through a guide roller 7, a vertically oscillating dancer roller 8, a feed roller 9 coupled to a supply moter (not shown) for supplying the taping tape 3 and a couple of pinch rollers 10 coming into contact with the feed roller which are substantially disposed on the upper and lower side thereof. Further, in front of the feed roller 9 there are arranged a tape cutter 11 for cutting the taping tape 3, a guide 12 for providing a tape leader by cutting an embossed tape of the tape 3 while leaving the corresponding portion of a cover tape of the tape 3 uncut and a product guide 13 capable of changing its position vertically. The product guide 13 is formed such that it has a size sufficient for it to be inserted between the side plates of the take-up reel A and is movable up and down freely at its base portion serving as a fulcrum. Therefore, when the take-up reel is removed, it moves upward mechanically to portions higher than the center of the take-up reel A. Further, at the intermediate portion of the product guide 13, there is attached a detector 14 adapted to detect the rear end of the taping tape 3 while the rear end of the guide 13 extends to a portion near an opening 2a of the groove 2 of the take-up reel A. The positional relationship between the product guide 13 and the groove 2 is such that the optimum result is obtained when a line of extension of the longitudinal axis of the groove 2 coincides with the axis of the product guide 13 although exact coincidence between the two is not always necessary. For example, even in case the groove is not so formed as to be directed toward the center of the reel core or is curved midway by a certain angle, if the top end of the product guide 13 is positioned near the opening of the groove, it will enter the groove to allow the tape to be taken up around the reel.

At a position above the take-up reel A there is arranged an adhesive tape supply mechanism C which is adapted to hold the rear end of the taping tape 3 fixed with an adhesive tape. This adhesive tape supply mechanism C comprises an adhesive tape reel 15 wound with a tape comprising a mount having an adhesive tape applied thereon at equal intervals, an arm 16 movable vertically to bend the supplied tape so as to peel the adhesive tape, a touch roller 17 protruding toward the top end of the arm 16 so as to apply the supplied adhesive tape by pressing, a tape feedout motor 18 and a tape mount winding shaft 19.

Further, in order to mount the take-up reel A on the output shaft 4 and to set the groove 2 formed in the core of the reel A always at a predetermined position, the following structure is provided. That is, a stock carrier is attached to the side surface of the take-up apparatus B in FIG. 2 in spaced apart and parallel relationships with the take-up reel A so as to move parallel with the latter. The stock carrier is provided with two reel insert rods capable of supporting take-up reels thereon parallelly. These rods project from the stock carrier in the horizontal direction opposite the output shaft 4 leaving some clearance from the latter. In this arrangement, one of the two reel insert rods may be used for supporting an empty (or unloaded) reel and the other for supporting a loaded reel such that the empty reel supported rod may have a guide rod at a predetermined position so as to allow it to fit in the groove formed in the core of the take-up reel so that the center of the core of the empty reel is fitted about the empty reel insert rod with the guide rod of the insert rod engaging the groove of the core of the reel, thereby keeping the reel as a spare.

In the case of the take-up reel B of the above structure, the taking up of the taping tape around the reel is performed in the following manner. To begin with, the take-up reel A is mounted at its predetermined position and the product guide 13 is set to its lower limit position so that the top end of the product guide 13 comes close to the opening 2a of the goove 2. Next, when the taping tape 3 is fed in succession by the action of the feed roller 9, the top end of the taping tape 3 which has passed the product guide 13 enters the groove 2. (This condition is shown by a solid line in FIG. 1). After the entry of the top end of the tape 3 into the groove 2, when the drive motor is actuated, the top end of the taping tape which has entered the groove 2 is bent thereat and taken up around the reel core. In the above condition, with the rotation of the take-up reel A and the travelling of the taping tape 3, the product guide 13a which is set free goes up to the position shown by an imaginary line D. Then, with further winding of the taping tape 3 until the detector (not shown) senses that a predetermined amount of windings of the tape has been reached, the product guide 13b will be at the position shown by an imaginary line E.

Figure 3:
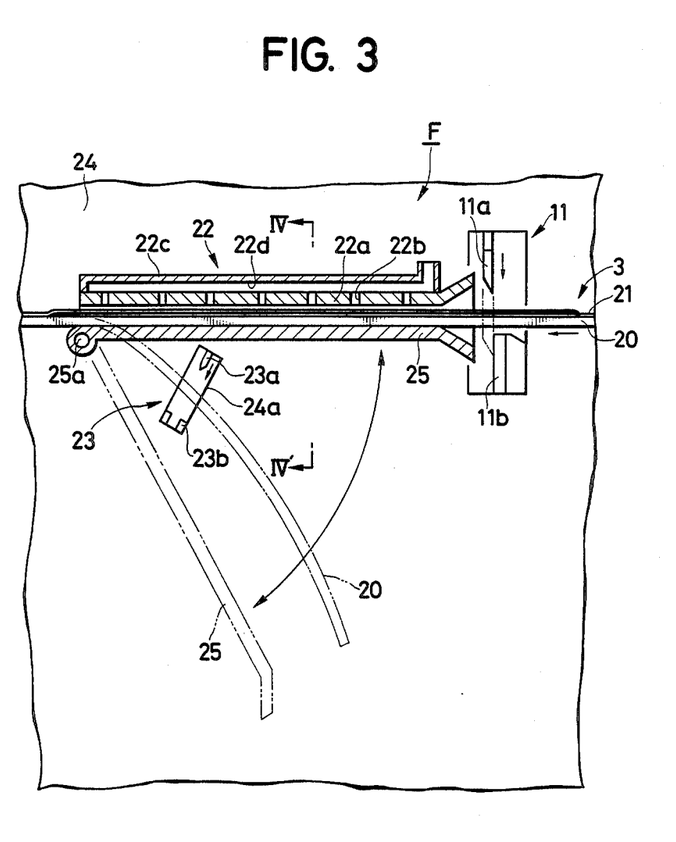
FIG. 3 is an illustrative view of a mechanism for forming a leader portion of the taping tape according to the present invention.
Figure 4:
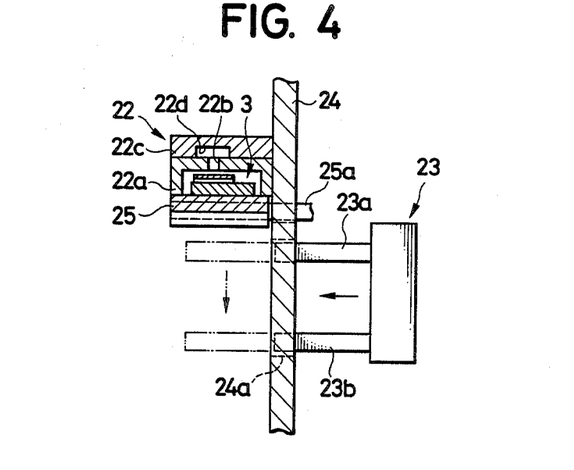
FIG. 4 is a sectional view taken along the IV—IV' line of FIG. 3.

In FIGS. 3 and 4, there is shown a tape leader forming mechanism F which includes a cutter 11 for cutting a non-deposited portion of the taping tape 3 consisting of a storage tape 20 and a cover tape 21 deposited on the upper surface of the storage tape 20, a holder 22 for holding the non-deposited portion of the cover tape 21 and a removing cutter 23 for removing the non-deposited portion of the storage tape 20 so that a tape leader is formed at the rear end of the taping tape 3.

The cutter 11 comprises a cutting blade 11a and a cutting base 11b to mate with the cutting blade and is fixed to a side plate 24.

The holder 22 comprises a U-shaped holding piece 22a and a support plate 25 by both of which a tape feeding passage is formed.

The holding piece 22a is attached to the side plate 24 and is provided with a plurality of sucking holes 22b spaced apart at predetermined intervals in the taping tape carrying direction, so as to suck and hold the cover tape 21 by air, and a frame 22c for allowing the individual sucking holes 22b to communicate with a sucking passage 22d.

The support plate 25 is movably mounted on the side plate 24 by means of a support shaft 25a which is coupled to a drive source such as a motor (not shown) and moves the support plate 25 vertically.

The removing cutter 23 comprises a cutting blade 23a and a cutting base 23b mating with the former and is located below the holder 22.

Figure 5:
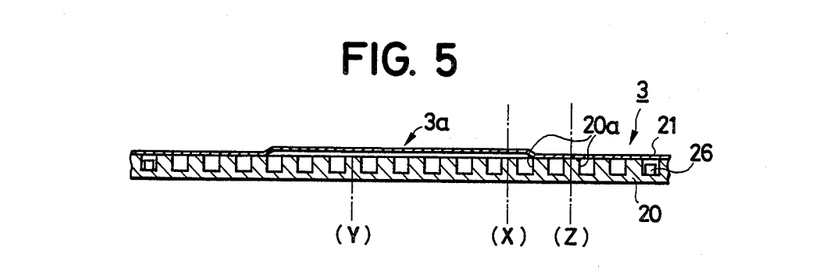
FIG. 5 is a sectional view of the taping tape according to the present invention.

As shown in FIG. 5, the taping tape 3 comprises the storage tape 20 and the cover tape 21 of which the former (20) is provided with a plurality of grooves 20a for receiving electronic parts 26 therein. Further, the taping tape 3 includes a non-deposited portion 3a of the storage tape 20 to which the cover tape 21 is not deposited and at portions before and after the non-deposited portions 3a, there are formed deposited portions where no electronic parts are received.

Figure 6:
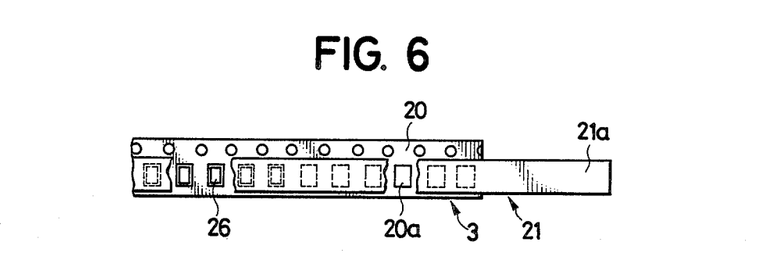
FIG. 6 is a plane view of the leader portion of the taping tape shown in FIG. 5.

To form a tape leader by the above-mentioned tape leader forming mechanism F, the non-deposited portion 3a of the taping tape 3 is cut by the cutter 11 at a position (X) and the non-deposited portion of the cover tape 21 is held by the holder 22a by the sucking action of the sucking holes 22b. Then the support plate 25 is moved downward so that the non-deposited portion of the storage tape 20 is separated from that of the cover tape 21 and droops down to the position of the removing cutter 23. The cutting blade 23a and the cutting base 23b of the removing cutter 23 project outside the side plate 24 through holes 24a to catch the non-deposited portion of the storage tape 20 and cut it at a position (Y) shown in FIG. 5 so that the tape leader 21a is formed at the rear end of the taping tape 3 as shown in FIG. 6. After the formation of the tape leader 21a, the support plate 25 moves upward to return to its initial position.

Further, in order to form a new top end of the taping tape, the tape is cut by the cutter 11 at a position (Z) shown in FIG. 5 lest the cover tape should be caught in the taping tape feeding passage.

Figure 7:
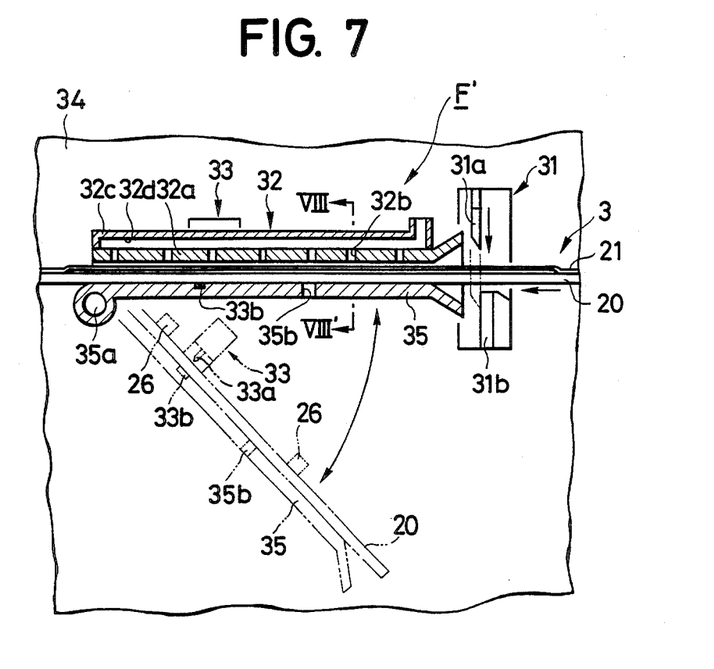
FIG. 7 is a front sectional view of another embodiment of the take-up apparatus according to the present invention.
Figure 8:
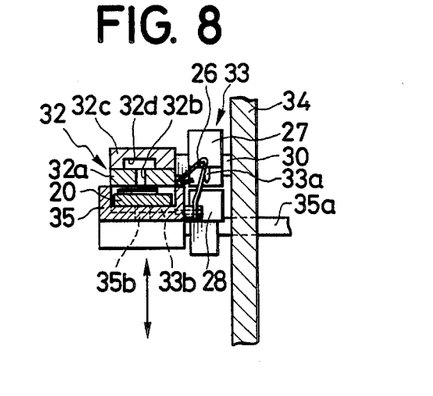
FIG. 8 designates a sectional view taken along the VIII—VIII' of FIG. 7.
Figure 9:
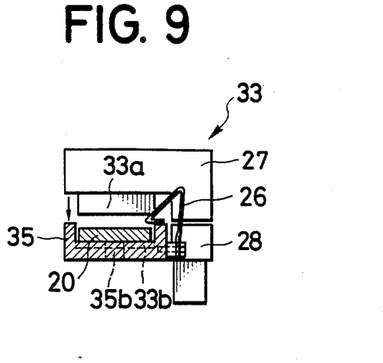
FIG. 9 is a sectional view illustrating the operations of a cutter means and a holding mechanism according to another embodiment of the present invention.

Next, a tape leader forming mechanism F' according to another embodiment of the present invention is shown in FIGS. 7 through 9 which mechanism comprises a cutter 31 for cutting a non-deposited portion of the taping tape 3 comprised of the storage tape 20 and the cover tape 21 to be deposited on the upper surface of the former, a holder 32 for holding the non-deposited portion of the cover tape cut by the cutter 31 and a removing cutter 33 for removing the non-deposited portion of the storage tape 20 cut by the cutter 31, thereby forming a tape leader at the rear end of the taping tape.

The cutter 31 comprises a cutting blade 31a and a cutting base 31b mating with the former, and is attached to a side plate 34 so as to project from the latter.

The holder 32 comprises a plate-like holder 32a and a U-shaped support member 35 both of which are combined to form a feeding passage for the taping tape 3.

The holder 32a is attached to the side plate 34 through the support member 30 and is provided with a plurality of sucking holes 32b spaced apart from one another at predetermined intervals in the taping tape carrying direction so as to suck and hold the cover tape 21 by air and a frame 32c for allowing the individual sucking holes 32b to communicate with a sucking passage 32d.

The support member 35 is movably mounted on the side plate 34 by means of a support shaft 35a which is coupled to a drive source such as a motor (not shown) and moves the support member 35 vertically. Further, the support member 35 is provided with a holding mechanism 26 adapted to prevent the storage tape 20 from floating up by keeping the tape 20 held by the support member 35 when the support member 35 has moved to leave away from the holder 32a, a discharge hole 35b for keeping the storage tape out of the support member 35 by air, and the cutter 33.

The holding mechanism 26 comprises substantially V-shaped leaf springs arranged at the front and the rear of the removing cutter 33, respectively, and fixed to the side end of the support member 35 facing the side plate 34, by means of fixing means such as screws. The leaf springs hold the side edges of the storage tape 20 on the support member 35 when the member 35 has come away from the holder 32a while when the holder 32a and the support member 35 join together, the side end of the holder 32a engages the member 35 to thereby come away from a grooved portion of the latter.

The removing cutter 33 comprises a cutting blade 33a and a cutting base 33b mating with the former of which the former, the cutting blade, is provided on a rotary section 27 rotatably mounted on a stationary section 28 fixed to the side end of the side plate 34 of the support member 35, through a rotary shaft and coupled to a drive source such as a motor or air cylinder (not shown). The cutting base 33b mating with the cutting blade 33a is mounted on the support member 35.

In order to form a tape leader by the tape leader forming mechanism F', the non-deposited portion 3a of the taping tape 3 is cut by the cutter 31 at the position (X) shown in FIG. 5 and the non-deposited position of the cover tape 21 is held by the holder 32a through the sucking action of its sucking holes 32b. Then the support member 35 is moved downward whereupon the non-deposited portion of the storage tape 20 is separated from that of the cover tape 21 and at the same time, it is held by the support member 35 through the holding mechanism. Thus, after the rotation of the support member 35, the rotary section 27 rotates by 90 degrees and the removing cutter cuts and removes the non-deposited portion of the storage tape 20 at a position (Y) shown in FIG. 5. The removed non-deposited portion of the storage tape 20 is then discharged by air from the discharge hole. Thus a tape leader 21a is formed at the rear end of the taping tape 3 as shown in FIG. 6. After the formation of the tape leader 21a, the rotary section 27 first rotates back by 90 degrees and then the support member 35 moves upward to return to its initial position.

Further, in order to form a new top end of the taping tape, the tape is cut by the cutter 31 at a position (Z) shown in FIG. 5 lest the cover tape should be caught in the taping tape feeding passage. Then, when the rear end (that is, the leader) of the taping tape has passed the detector 14 of the product guide 13, the detector 14 senses it and sends a signal to an adhesive tape supply mechanism H thereby feeding out the tape. The above process will be described by referring to FIG. 10.

Figure 10:
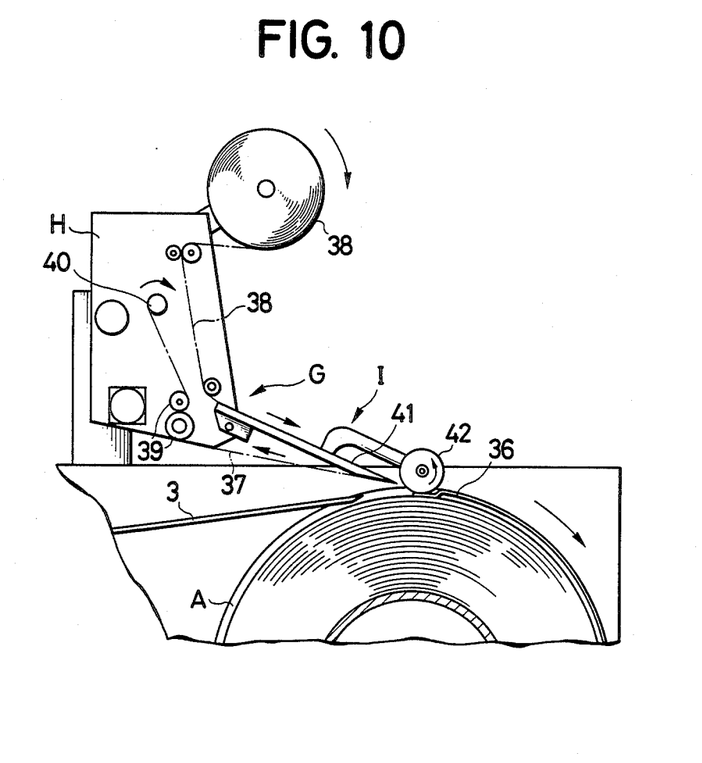
FIG. 10 is an illustrative view showing a state in which an adhesive tape is applied to the taping tape at the time of completion of winding of the taping tape according to the present invention.

An adhesive tape applying device G comprises the adhesive tape supply mechanism H and an arm I as shown in FIG. 10.

The adhesive tape supply mechanism H comprises a roll of tape 38 comprised of a mount 37 and adhesive tape 36 applied to the former at predetermined intervals, drive pinch rollers 39 for carrying the tape 38 through the arm I by being guided by rollers and a rotary drive shaft 40 adapted to take up the remaining portion of the tape mount 37 after separating the adhesive tape 36 therefrom by arm I.

The arm I is movable freely up and down at its base portion serving as a fulcrum by a suitable drive mechanism. At the top end of the arm I there is formed a folded section 41 adapted to peel the adhesive tape 36 from the roll of tape 38 and further, a thrust roller 42 is attached to the front portion of the folded section 41 through a support rod so as to rotate freely. The thrust roller 42 is so attached that its lower outer peripheral end is somewhat lower than the level of the folded section 41.

Upon completion of winding of the taping tape 3, the detector 14 senses that a set amount of windings have been reached, and the taping tape 3 is cut whereupon the adhesive tape applying mechanism G operates again. Thus, as shown in FIG. 10, the arm I moves downward and the thrust roller 42 comes into contact with the outer peripheral surface of the outermost winding of the tape already taken up around the take-up roll A to rotate therewith. Further, the adhesive tape supply mechanism H also operates to feed out the adhesive tape 36 and begin to peel the tape from the tape mount 37 and as the tape mount 37 is taken up, one end of the adhesive tape 36 is pressed between the thrust roller 42 and the rear end of the taping tape 3 so that a part of the adhesive tape 36 is applied to the rear end of the taping tape. Then, as the take-up reel A rotates, the remaining portion of the adhesive tape 36 is applied to the outer peripheral surface of the taken-up taping tape and pressed between the thrust roller 42 and the applied surface thereby fixing the rear end of the taping tape. Thus, in the above manner, the adhesive tape 36 is applied over the rear end of the taping tape 3 and the peripheral surface of the outermost portion of the tape adjacent thereto to complete the winding operation.

As described above, according to the present invention, the taping tape is caused to enter and engage the groove formed in the core of the take-up reel through the guide mechanism so as to smoothly take up the taping tape around the take-up reel by rotating the reel, then, upon completion of winding of the taping tape, the non-deposited portions of the cover tape and the storage tape of which the taping tape is formed are cut by the cutter thereby forming a tape leader and finally, the tape leader is fixed to the peripheral surface of the outermost part of the taping tape already taken up around the take-up reel. Accordingly, all the above processes are performed by a continuous automation system according to the present invention so that the take-up time can be shortened to a great degree, the manufacturing cost can be sharply reduced and the production capacity can be remarkably improved.

While the present invention has been described with reference to preferred embodiments thereof, it is to be understood that some modifications or variations may be made all of which are of course to be included in the appended claims without departing from the spirit and scope of this invention. For example, as described in detail with respect to the foregoing embodiments, the step of starting the winding of the taping tape, that is, introducing and engaging the top end of the taping tape into and with the opening of the groove in the core of the take-up reel, may be replaced with the step of terminating the winding of the tape as practised in the present invention, that is, applying the adhesive tape from the adhesive tape supply mechanism to the opening of the groove in the core of the take-up reel by means of the movable arm, and it should be particularly noted that such modification is to be included in the scope of the appended claims.

What is claimed is:

1. A take-up method for a taping tape comprising, in combination, a storage tape for storing electronic parts therein and a cover tape deposited over the upper surface thereof which method is characterized by the steps of:
   carrying the taping tape toward a take up reel;
   introducing a top end of the taping tape into an opening of a groove formed in a core of said take-up reel through a guide mechanism arranged in the vicinity of said core of said take-up reel and then engaging said top end with said opening;
   causing said taping tape to be taken up around the core of said take-up reel by rotating said take-up reel;
   cutting a non-deposited portion of said taping tape by a cutter means at the final stage of winding of said taping tape onto said take-up reel;
   holding by a holder means a non-deposited portion of said cover tape at the cut end of said taping tape cut by said cutter means and at the same time, cutting and removing a non-deposited portion of said storage tape by a removing cutter means thereby forming at the rear end of said taping tape a tape leader consisting only of said cover tape; and
   causing said tape leader to be applied and fixed to the outer peripheral surface of the outermost winding of said taping tape with an adhesive tape supplied from an adhesive tape supply mechanism by using an adhesive tape applying means comprising a movable arm and adapted to apply said adhesive tape to said tape leader.

2. An apparatus for taking up a taping tape comprising a storage tape for storing electronic parts therein and a cover tape deposited on an upper surface of said storage tape, which apparatus comprises:
   a take-up reel for taking up said taping tape therearound and having a core with a groove formed therein for receiving and holding a leading edge of said tape;
   a guide means arranged in the vicinity of said core of said take-up reel and adapted to guide the leading end of said taping tape toward the core of said take-up reel;
   a cutter means for cutting a non-deposited portion of said taping tape at the final stage of winding of said taping tape onto said take-up reel;
   a holding means for holding a non-deposited portion of said cover tape of said taping tape cut by said cutter means, so as to form a tape leader;
   a removing cutter means for cutting and removing a non-deposited portion of said storage tape of said taping tape cut by said cutter means;
   an adhesive tape supply mechanism for supplying an adhesive tape to be applied to said tape leader; and
   an adhesive tape applying means including a movable arm capable of applying and fixing said tape leader to the outermost winding of said taping tape around the core of said take-up reel with said adhesive tape.

* * * * *

UNITED STATES PATENT AND TRADEMARK OFFICE
CERTIFICATE OF CORRECTION

PATENT NO. : 4,747,553
DATED : May 31, 1988
INVENTOR(S) : Ogawa

It is certified that error appears in the above-identified patent and that said Letters Patent is hereby corrected as shown below:

On the title page Item (30) should read

-- (30) Foreign Application Priority Data

May 14, 1986 (JP)..........................61-111291
November 11, 1986 (JP) ....................61-267945
February 14, 1987 (JP) ....................62-32169

Signed and Sealed this

Twenty-second Day of November, 1988

Attest:

DONALD J. QUIGG

*Attesting Officer*      *Commissioner of Patents and Trademarks*